US012567848B2

(12) United States Patent
Park

(10) Patent No.: US 12,567,848 B2
(45) Date of Patent: Mar. 3, 2026

(54) REFERENCE VOLTAGE CONTROLLED EQUALIZATION INPUT DATA BUFFER CIRCUIT CAPABLE OF AUTOMATICALLY CONTROLLING POWER GAIN AND PROVIDING EQUALIZATION EFFECT

(71) Applicant: Fujian Jinhua Integrated Circuit Co., Ltd., Quanzhou City (CN)

(72) Inventor: Minho Park, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 483 days.

(21) Appl. No.: 18/204,381

(22) Filed: May 31, 2023

(65) Prior Publication Data

US 2024/0250653 A1 Jul. 25, 2024

(30) Foreign Application Priority Data

Jan. 20, 2023 (CN) .......................... 202310081785.9
Jan. 20, 2023 (CN) .......................... 202320154318.X

(51) Int. Cl.
| | |
|---|---|
| *H03G 3/30* | (2006.01) |
| *H03F 3/04* | (2006.01) |
| *H03K 19/20* | (2006.01) |

(52) U.S. Cl.
CPC ................. *H03G 3/30* (2013.01); *H03F 3/04* (2013.01); *H03K 19/20* (2013.01); *H03G 2201/103* (2013.01)

(58) Field of Classification Search
CPC .. H03G 3/30; H03G 2201/103; H03G 1/0023; H03G 1/0088; H03G 3/45098; H03F 3/04; H03F 2203/45506; H03F 3/45183; H03F 3/45475; H03F 3/72; H03F 3/45071; H03F 1/34; H03K 19/20; G11C 7/1084; G11C 7/14; G11C 11/4093
USPC .................................................. 330/254, 260
See application file for complete search history.

(56) References Cited

U.S. PATENT DOCUMENTS

| | | | |
|---|---|---|---|
| 7,701,257 B2 | 4/2010 | Bae | |
| 7,817,714 B2 | 10/2010 | Bae | |
| 8,391,347 B2 | 3/2013 | Kim | |
| 10,992,277 B1 * | 4/2021 | Sun ...................... H03G 3/3036 |
| 11,075,610 B2 * | 7/2021 | Hong ........................ H03F 3/68 |
| 11,482,973 B2 * | 10/2022 | Kang ................... H03G 1/0029 |

* cited by examiner

*Primary Examiner* — Khanh V Nguyen
(74) *Attorney, Agent, or Firm* — Winston Hsu

(57) ABSTRACT

A reference voltage controlled equalization input data buffer circuit includes a first amplifier, a second amplifier, a feedback signal generator, a reference voltage converter, a reference voltage multiplexing circuit, and a gain control unit. The first amplifier includes a first input terminal for receiving a data signal, a second input terminal for receiving a reference voltage, a first output terminal, and a second output terminal. The second amplifier is coupled to the first amplifier. The feedback signal generator is coupled to the second amplifier. The reference voltage converter is used for receiving the reference voltage. The reference voltage multiplexing circuit is coupled to the second amplifier and the reference voltage converter. The gain control unit is coupled to the feedback signal generator, the first output terminal of the first amplifier, the second output terminal of the first amplifier, and the reference voltage multiplexing circuit.

10 Claims, 5 Drawing Sheets

10

11

POUTB          PT

POUT           PB

REFERENCE VOLTAGE CONTROLLED EQUALIZATION INPUT DATA BUFFER CIRCUIT CAPABLE OF AUTOMATICALLY CONTROLLING POWER GAIN AND PROVIDING EQUALIZATION EFFECT

BACKGROUND OF THE INVENTION

1. Field of the Invention

The present invention illustrates a reference voltage controlled equalization input data buffer circuit, and more particularly, a reference voltage controlled equalization input data buffer circuit capable of automatically controlling power gain and providing equalization effect.

2. Description of the Prior Art

With the rapid development of technology, various volatile and non-volatile memory components are used in computer systems. Dynamic random access memory (DRAM) is a semiconductor memory categorized as a volatile memory. DRAM can use a plurality of charges stored in a capacitor for indicating if a binary bit logic is 1 or 0. DRAM can be regarded as a short-term data storage unit of the computer system. Since DRAM can be used for saving data currently used, the data currently used can be quickly accessed by the computer system.

DRAM can provide high-speed data transmission capability and high bandwidth utilization. However, since the high-speed data transmission capability and high bandwidth utilization of DRAM are required, power consumption is greatly increased, especially in Double-Data-Rate (DDR) 4 and DDR 5 based DRAM applications. Thus, to develop a voltage controlled equalization input data buffer circuit capable of automatically y controlling power gain and providing equalization effect is an important design issue.

SUMMARY OF THE INVENTION

In an embodiment of the present invention, a reference voltage controlled equalization input data buffer circuit is disclosed. The reference voltage controlled equalization input data buffer circuit comprises a first amplifier, a second amplifier, a feedback signal generator, a reference voltage converter, a reference voltage multiplexing circuit, and a gain control unit. The first amplifier comprises a first input terminal configured to receive a data signal, a second input terminal configured to receive a reference voltage, a first output terminal, and a second output terminal. The second amplifier is coupled to the first output terminal of the first amplifier and the second output terminal of the first amplifier. The feedback signal generator is coupled to the second amplifier. The reference voltage converter is configured to receive the reference voltage. The reference voltage multiplexing circuit is coupled to the second amplifier and the reference voltage converter. The gain control unit is coupled to the feedback signal generator, the first output terminal of the first amplifier, the second output terminal of the first amplifier, and the reference voltage multiplexing circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
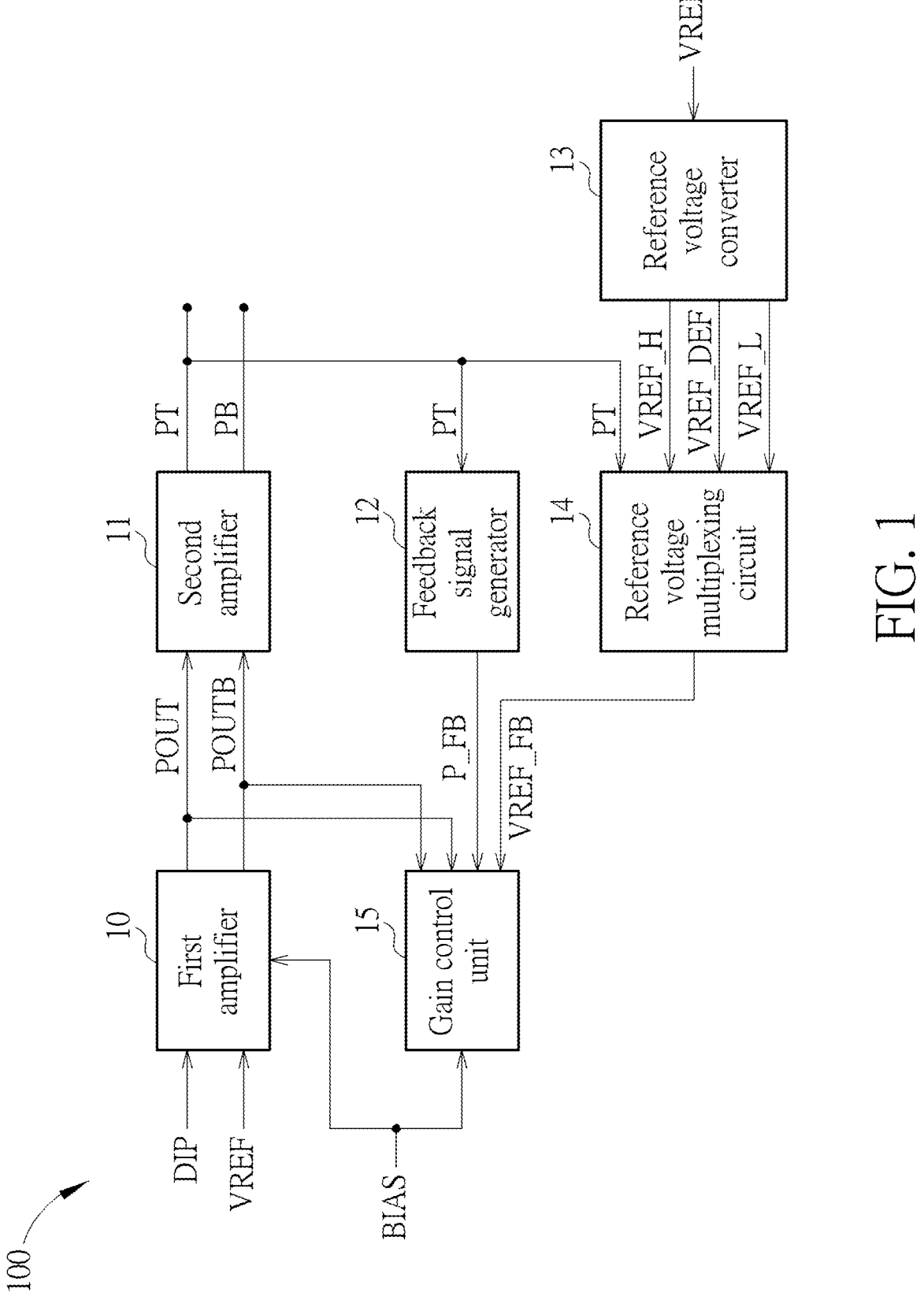
FIG. 1 is a reference voltage controlled equalization input data buffer circuit according to an embodiment of the present invention.

FIG. 1 is a reference voltage controlled equalization input data buffer circuit 100 according to an embodiment of the present invention. The reference voltage controlled equalization input data buffer circuit 100 can automatically control power gain and provide equalization effect. The reference voltage controlled equalization input data buffer circuit 100 includes a first amplifier 10, a second amplifier 11, a feedback signal generator 12, a reference voltage converter 13, a reference voltage multiplexing circuit 14, and a gain control unit 15. The first amplifier 10 includes a first input terminal, a second input terminal, a first output terminal, and a second output terminal. The first input terminal is used for receiving a data signal DIP. The second input terminal is used for receiving a reference voltage VREF. The second amplifier 11 is coupled to the first output terminal of the first amplifier 10 and the second output terminal of the first amplifier 10. The feedback signal generator 12 is coupled to the second amplifier 11. The reference voltage converter 13 is used for receiving the reference voltage VREF. The reference voltage multiplexing circuit 14 is coupled to the second amplifier 11. The gain control unit 15 is coupled to the feedback signal generator 12, the first output terminal of the first amplifier 10, the second output terminal of the first amplifier 10, and the reference voltage multiplexing circuit 14. In the reference voltage controlled equalization input data buffer circuit 100, the first amplifier 10, the second amplifier 11, the feedback signal generator 12, the reference voltage multiplexing circuit 14, and the gain control unit 15 form a circuit loop for automatically controlling power gain according to the data signal DIP and the reference voltage VREF. For example, the data signal DIP and the reference voltage VREF can be amplified by the first amplifier 10 and the second amplifier 11. Then, a feedback signal P_FB can be generated by the feedback signal generator 12 according to output signals of the second amplifier 11. The reference voltage VREF can be converted into a first signal VREF_H having a first reference voltage level, a second signal VREF_DEF having a second reference voltage level, and a third signal VREF_L having a third reference voltage level by the reference voltage converter 13. The first signal VREF_H having the first reference voltage level, the second signal VREF_DEF having the second reference voltage level, and the third signal VREF_L having the third reference voltage level can be converted into a reference voltage feedback signal VREF_FB by the reference voltage multiplexing circuit 14. The gain control unit 15 can adjust power gain after two outputs (i.e., POUT and POUTB) of the first amplifier 10, the feedback signal P_FB, and the reference voltage feedback signal VREF_FB are received. Since the reference voltage feedback signal VREF_FB is related to the reference voltage VREF, the gain control unit 15 can automatically control the power gain by using the reference voltage VREF and the data signal DIP. Circuit details of the reference voltage controlled equalization input data buffer circuit 100 are illustrated later.

Figures 2, 3:
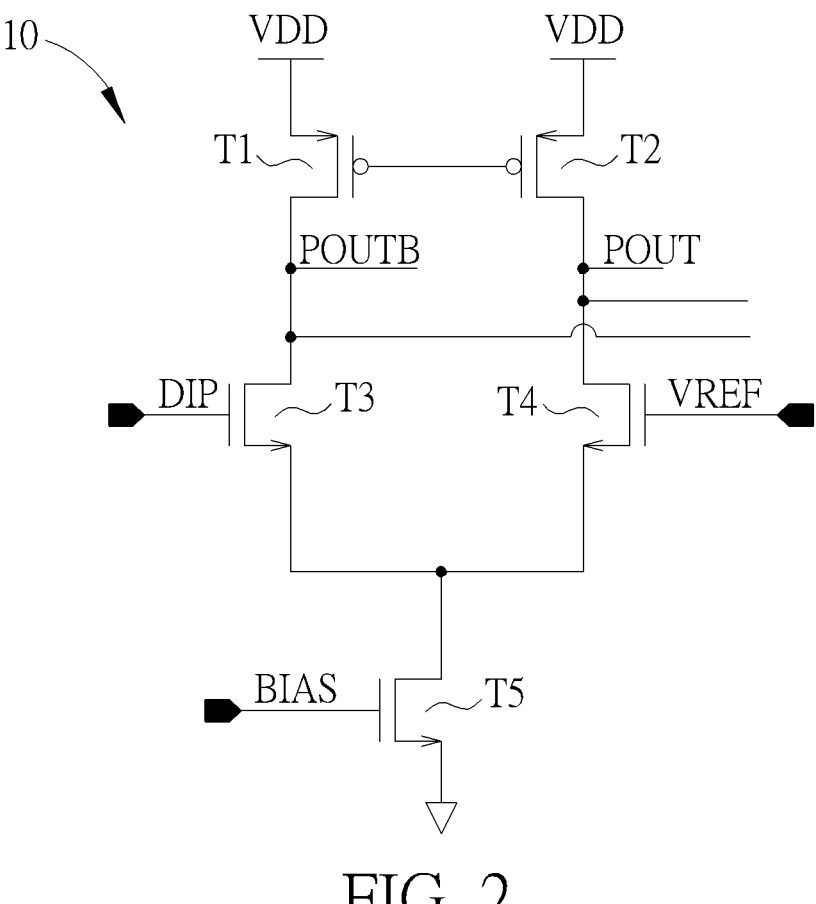
FIG. 2 is a structure of a first amplifier of the reference voltage controlled equalization input data buffer circuit in FIG. 1.
FIG. 3 is a structure of a second amplifier of the reference voltage controlled equalization input data buffer circuit in FIG. 1.

FIG. 2 is a structure of the first amplifier 10 of the reference voltage controlled equalization input data buffer circuit 100. FIG. 3 is a structure of the second amplifier 11 of the reference voltage controlled equalization input data buffer circuit 100. The first amplifier 10 and the second amplifier 11 can be any type of amplifier. For example, the first amplifier 10 and the second amplifier 11 can be voltage amplifiers, current amplifiers, or differential amplifiers. In FIG. 2, the first amplifier 10 can be a differential amplifier. The first amplifier 10 can include a first transistor T1, a second transistor T2, a third transistor T3, a fourth transistor T4, and a fifth transistor T5. The first transistor T1 includes a first terminal for receiving a working voltage VDD, a second terminal, and a control terminal. The second transistor T2 includes a first terminal for receiving the working voltage VDD, a second terminal, and a control terminal coupled to the control terminal of the first transistor T1. The third transistor T3 includes a first terminal coupled to the second terminal of the first transistor T1, a second terminal, and a control terminal for receiving the data signal DIP. The fourth transistor T4 includes a first terminal coupled to the second terminal of the second transistor T2, a second terminal coupled to the second terminal of the third transistor T3, and a control terminal for receiving the reference voltage VREF. The fifth transistor T5 includes a first terminal coupled to the second terminal of the fourth transistor T4, a second terminal coupled to a ground terminal, and a control terminal for receiving a biased voltage signal BIAS. Here, the first transistor T1 and the second transistor T2 can be P-type Metal-Oxide-Semiconductor Field Effect Transistors (PMOSFET). The third transistor T3, the fourth transistor T4, and the fifth transistor T5 can be N-type Metal-Oxide-Semiconductor Field Effect Transistors (NMOSFET). The biased voltage signal BIAS can be a customized or predetermined voltage signal for controlling a conduction state of the fifth transistor T5. Therefore, a current of the fifth transistor T5 can be controlled by the biased voltage signal BIAS. Further, when the third transistor T3 and the fourth transistor T4 are operated in a linear region and the first transistor T1 and the second transistor T2 are enabled, two outputs of the first amplifier 10 (i.e., the first output signal POUTB and the second output signal POUT) can be linearly amplified according to the data signal DIP and the reference voltage VREF. Particularly, the first output signal POUTB is at the first terminal of the third transistor T3. The second output signal POUT is at the first terminal of the fourth transistor T4. Further, the first output signal POUTB and the second output signal POUT are complementary. In FIG. 3, the second amplifier 11 can be a differential amplifier. The first output signal POUTB and the second output signal POUT of the first amplifier 10 are inputted to the second amplifier 11. The second amplifier 11 includes a first input terminal coupled to the first output terminal of the first amplifier 10, a second input terminal coupled to the second output terminal of the first amplifier 10, a first output terminal coupled to the feedback signal generator 12, and a second output terminal. Therefore, the first output signal POUTB and the second output signal POUT can be amplified to generate the third output signal PT and the fourth output signal PB by the second amplifier 11. The third output signal PT is outputted from the first output terminal of the second amplifier 11. The fourth output signal PB is outputted from the second output terminal of the second amplifier 11. Further, the third output signal PT and the fourth output signal PB are complementary.

Figure 4:
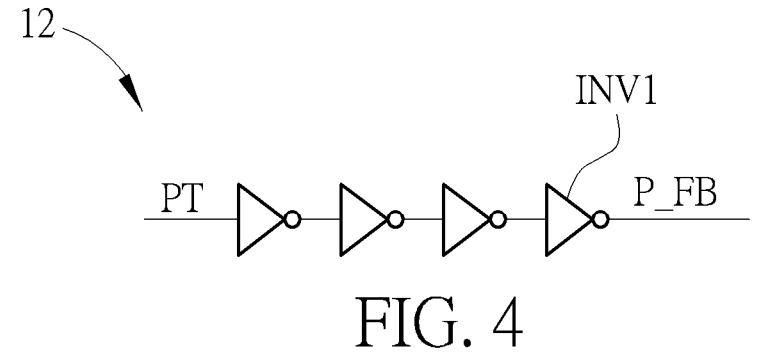
FIG. 4 is a structure of a feedback signal generator of the reference voltage controlled equalization input data buffer circuit in FIG. 1.

FIG. 4 is a structure of the feedback signal generator 12 of the reference voltage controlled equalization input data buffer circuit 100. The feedback signal generator 12 includes a plurality of first inverters INV1 coupled in series. The plurality of first inverters INV1 are used for delaying a signal of the first output terminal of the second amplifier 11 for outputting a feedback signal P_FB. In other words, the third output signal PT outputted from the second amplifier 11 can be delayed by the feedback signal generator 12 for generating the feedback signal P_FB. As shown in FIG. 4, the number of inverters in the feedback signal generator 12 is not limited. Further, since each inverter has its time delay, the more inverters used in the feedback signal generator 12, the greater time delay is introduced.

Figure 5:
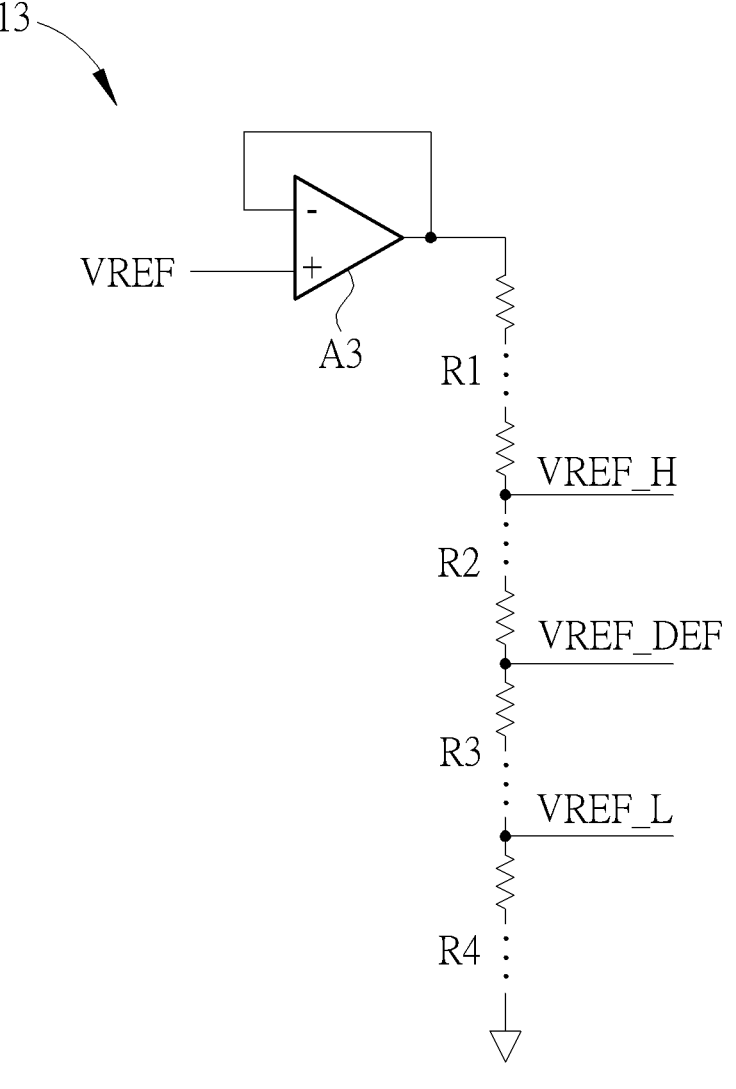
FIG. 5 is a structure of a reference voltage converter of the reference voltage controlled equalization input data buffer circuit in FIG. 1.

FIG. 5 is a structure of the reference voltage converter 13 of the reference voltage controlled equalization input data buffer circuit 100. The reference voltage converter 13 includes a third amplifier A3, a first resistor string R1, a second resistor string R2, a third resistor string R3, and a fourth resistor string R4. The third amplifier A3 is used for receiving the reference voltage VREF. The first resistor string R1 is formed by coupling at least one first resistor in series. The first resistor string R1 includes a first terminal coupled to the third amplifier A3, and a second terminal used for outputting the first signal VREF_H having the first reference voltage level. The second resistor string R2 is formed by coupling at least one second resistor in series. The second resistor string R2 includes a first terminal coupled to the second terminal of the first resistor string R1, and a second terminal used for outputting the second signal VREF_DEF having the second reference voltage level. The third resistor string R3 is formed by coupling at least one third resistor in series. The third resistor string R3 includes a first terminal coupled to the second terminal of the second resistor string R2, and a second terminal used for outputting the third signal VERF_L having the third reference voltage level. The fourth resistor string R4 is formed by coupling at least one fourth resistor in series. The fourth resistor string R4 includes a first terminal coupled to the second terminal of the third resistor string R3, and a second terminal coupled to a ground terminal. In the reference voltage converter 13, the first resistor string R1, the second resistor string R2, the third resistor string R3, and the fourth resistor string R4 form a voltage divider. In other words, after the reference voltage VREF is amplified by the third amplifier A3, the first signal VREF_H having the first reference voltage level, the second signal VREF_DEF having the second reference voltage level, the third signal VERF_L having the third reference voltage level can be generated by using the voltage divider of the reference voltage converter 13. Further, the first reference voltage level is greater than the second reference voltage level. The second reference voltage level is greater than the third reference voltage level. Further, the first reference voltage level, the second reference voltage level, and the third reference voltage level can be derived by using a voltage divider rule. Therefore, derivation details are omitted here.

Figure 6:
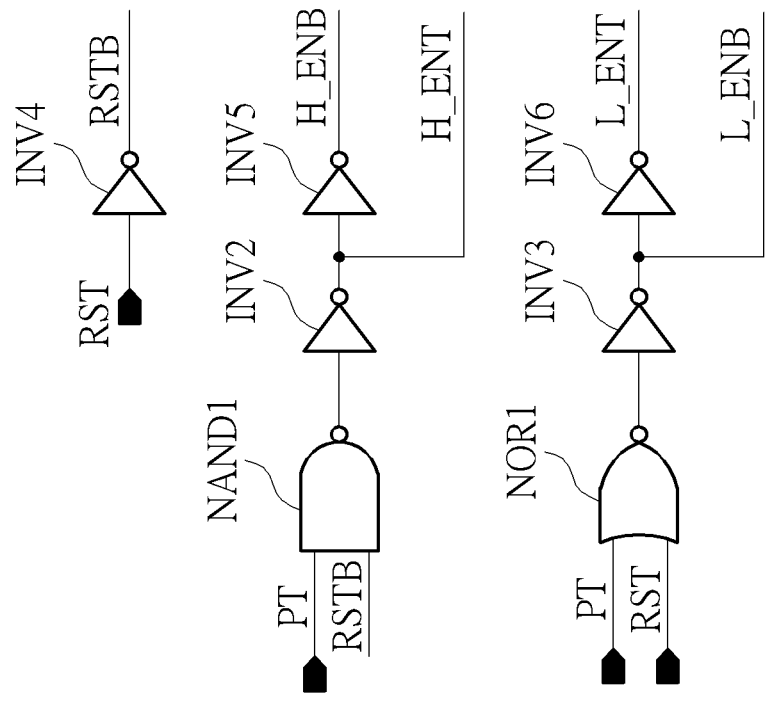
FIG. 6 is a structure of a reference voltage multiplexing circuit of the reference voltage controlled equalization input data buffer circuit in FIG. 1.
Figure 6:
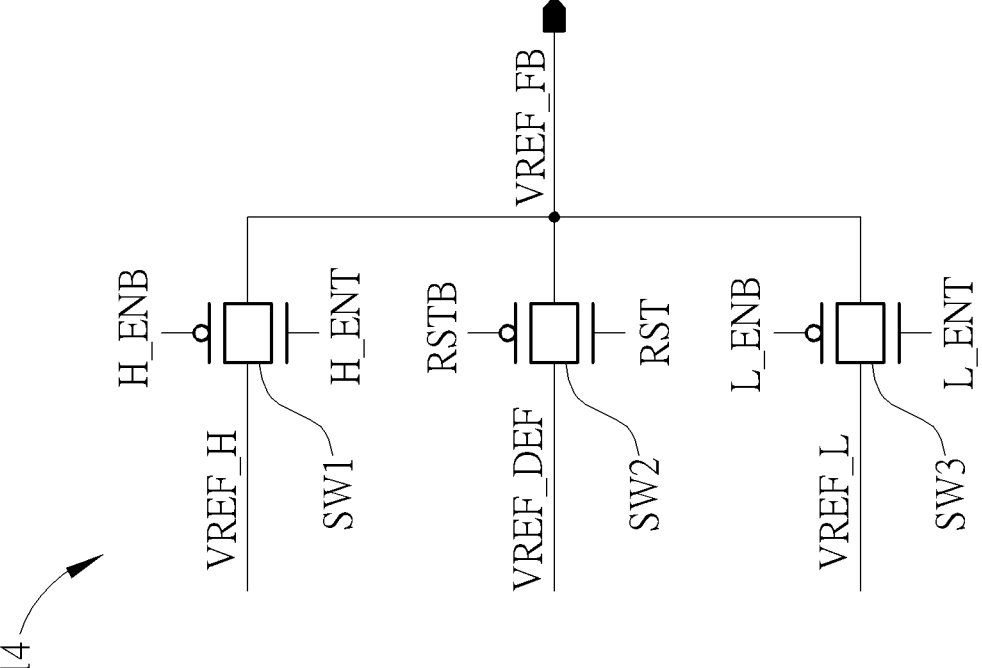

FIG. 6 is a structure of the reference voltage multiplexing circuit 14 of the reference voltage controlled equalization input data buffer circuit 100. The reference voltage multiplexing circuit 14 includes a first switch SW1, a second switch SW2, and a third switch SW3. The first switch SW1 includes an input terminal for receiving the first signal VREF_H having the first reference voltage level, a first control terminal for receiving a first control signal H_ENB, a second control terminal for receiving a second control signal H_ENT, and an output terminal for outputting a reference voltage feedback signal VREF_FB. The second switch SW2 includes an input terminal for receiving the second signal VREF_DEF having the second reference voltage level, a first control terminal for receiving the third control signal RSTB, a second control terminal for receiving the fourth control signal RST, and an output terminal coupled to the output terminal of the first switch SW1. The third switch SW3 includes an input terminal for receiving the third signal VERF_L having the third reference voltage level, a first control terminal for receiving the fifth control signal L_ENB, a second control terminal for receiving the sixth control signal L_ENT, and an output terminal coupled to the output terminal of the first switch SW1. In the reference voltage multiplexing circuit 14 of FIG. 6, the first switch SW1, the second switch SW2, and the third switch SW3 each further comprise pair-wised N-type Metal-Oxide-Semiconductor Field Effect Transistor and P-type Metal-Oxide-Semiconductor Field Effect Transistor. Further, the first control signal H_ENB and the second control signal H_ENT are complementary. The third control signal RSTB and the fourth control signal RST are complementary. The fifth control signal L_ENB and the sixth control signal L_ENT are complementary. In other words, the first control signal H_ENB and the second control signal H_ENT can control the first switch SW1 to enter a turned-on state or a turned-off state. The third control signal RSTB and the fourth control signal RST can control the second switch SW2 to enter the turned-on state or the turned-off state. The fifth control signal L_ENB and the sixth control signal L_ENT can control the third switch SW3 to enter the turned-on state or the turned-off state. Circuits of generating the first control signal H_ENB, the second control signal H_ENT, the third control signal RSTB, the fourth control signal RST, the fifth control signal L_ENB, and the sixth control signal L_ENT are illustrated below.

In FIG. 6, the reference voltage multiplexing circuit 14 further includes a NAND gate NAND1, a NOR gate NOR1, a second inverter INV2, a third inverter INV3, a fourth inverter INV4, a fifth inverter INV5, and a sixth inverter INV6. The NAND gate NAND1 includes a first input terminal coupled to the second amplifier 11 for receiving the third output signal PT, a second input terminal for receiving the third control signal RSTB, and an output terminal. The NOR gate NOR1 includes a first input terminal coupled to the second amplifier 11 for receiving the third output signal PT, a second input terminal for receiving the fourth control signal RST, and an output terminal. The second inverter INV2 includes an input terminal coupled to the output terminal of the NAND gate NAND1, and an output terminal for outputting the second control signal H_ENT. The third inverter INV3 includes an input terminal coupled to the output terminal of the NOR gate NOR1, and an output terminal for outputting the fifth control signal L_ENB. The fourth inverter INV4 includes an input terminal for receiving the fourth control signal RST, and an output terminal for outputting the third control signal RSTB. The fifth inverter INV5 includes an input terminal coupled to the output terminal of the second inverter INV2, and an output terminal for outputting the first control signal H_ENB. The sixth inverter INV6 includes an input terminal coupled to the output terminal of the third inverter INV3, and an output terminal for outputting the sixth control signal L_ENT. Therefore, the first control signal H_ENB, the second control signal H_ENT, the third control signal RSTB, the fourth control signal RST, the fifth control signal L_ENB, and the sixth control signal L_ENT can be adjusted by using the NAND gate NAND1, the NOR gate NOR1, the second inverter INV2, the third inverter INV3, the fourth inverter INV4, the fifth inverter INV5, and the sixth inverter INV6 according to the third output signal PT. Further, the first control signal H_ENB, the second control signal H_ENT, the third control signal RSTB, the fourth control signal RST, the fifth control signal L_ENB, and the sixth control signal L_ENT can control the switches SW1 to SW3. The reference voltage feedback signal VREF_FB outputted from the reference voltage multiplexing circuit 14 is related to the third output signal PT, the first signal VREF_H having the first reference voltage level, the second signal VREF_DEF having the second reference voltage level, and the third signal VERF_L having the third reference voltage level (i.e., as shown in FIG. 1).

For example, it is assumed that the reference voltage multiplexing circuit 14 is turned-on (i.e., the reference voltage controlled equalization input data buffer circuit 100 is not operated under a reset state). If the first output terminal of the second amplifier 11 is at a high voltage, the third output signal PT is at a high voltage. For the NAND gate NAND1, the output of the NAND gate NAND1 and the third control signal RSTB are complementary. Therefore, the output of the second inverter INV2 and the third control signal RSTB are identical. As a result, the second control signal H_ENT and the third control signal RSTB are identical. The first control signal H_ENB and the third control signal RSTB are complementary. Therefore, when the third control signal RSTB is at a high voltage, the first control signal H_ENB is at a low voltage and the second control signal H_ENT is at a high voltage. Therefore, the first switch SW1 is turned-on. As a result, the first signal VREF_H having the first reference voltage can be enabled. For the NOR gate NOR1, when the third output signal PT is at a high voltage, the output of the NOR gate NOR1 is at a low voltage. Therefore, the output of the third inverter INV3 is at a high voltage. The fifth control signal L_ENB is at a high voltage. The sixth control signal L_ENT is at a low voltage. As a result, the third switch SW3 is turned-off. The third signal VERF_L having the third reference voltage level is disabled. Further, when the first output terminal of the second amplifier 11 is at a low voltage, the first signal VREF_H is disabled and the third signal VREF_L is enabled. Details and signal derivations are similar to the aforementioned embodiments. Therefore, they are omitted here.

Figure 7:
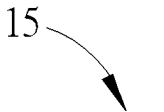
FIG. 7 is a structure of a gain control unit of the reference voltage controlled equalization input data buffer circuit in FIG. 1.
Figure 7:
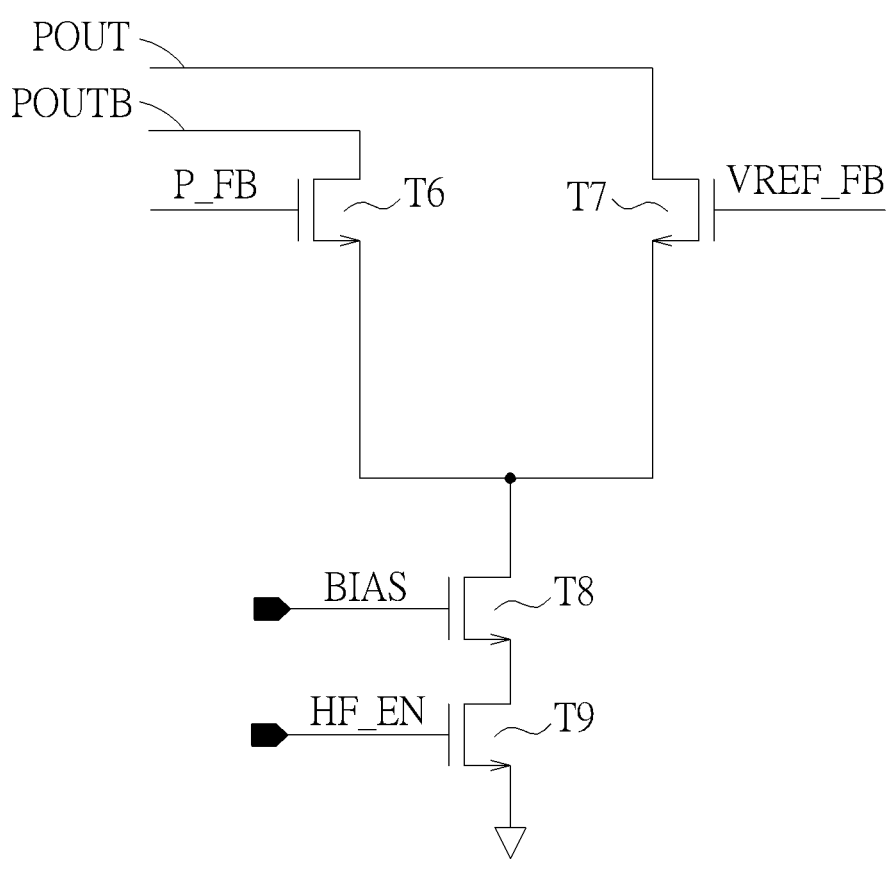

FIG. 7 is a structure of the gain control unit 15 of the reference voltage controlled equalization input data buffer circuit 100. The gain control unit 15 includes a sixth transistor T6, a seventh transistor T7, an eighth transistor T8, and a ninth transistor T9. The sixth transistor T6 includes a first terminal coupled to the first output terminal of the first amplifier 10 (i.e., for receiving the first output signal POUTB), a second terminal, and a control terminal coupled to the feedback signal generator 12 for receiving the feedback signal P_FB. The seventh transistor T7 includes a first terminal coupled to the second output terminal of the first amplifier 10 (i.e., for receiving the second output signal POUT), a second terminal coupled to the second terminal of the sixth transistor T6, and a control terminal for receiving the reference voltage feedback signal VREF_FB. The eighth transistor T8 includes a first terminal coupled to the second terminal of the seventh transistor T7, a second terminal, and a control terminal for receiving the biased voltage signal BIAS. Here, the biased voltage signal BIAS can be the customized or predetermined voltage signal for controlling a conduction state of the eighth transistor T8. The ninth transistor T9 includes a first terminal coupled to the eighth transistor T8, a second terminal coupled to a ground terminal, and a control terminal for receiving an enabling signal HF_EN. In the gain control unit 15, when the eighth transistor T8 is an NMOSFET, a voltage of the biased voltage signal BIAS can control the conduction state of the eighth transistor T8. Therefore, a current of the eighth transistor T8 can be controlled by the biased voltage signal BIAS. In the gain control unit 15, the sixth transistor T6, the seventh transistor T7, the eighth transistor T8, and the ninth transistor T9 are NMOSFETs. The enabling signal HF_EN can be regarded as an On-Off key signal. For example, if the enabling signal HF_EN is a low voltage signal, the ninth transistor T9 is disabled. Therefore, the current of the ninth transistor T9 is absent. As a result, the gain control unit 15 is turned off (i.e., disabled to adjust the voltage gain or power gain). If the enabling signal HF_EN is a high voltage signal, the ninth transistor T9 is turned on. As a result, the gain control unit 15 can adjust the voltage gain or power gain according to the biased voltage signal BIAS, the feedback signal P_FB, and the reference voltage feedback signal VREF_FB. Similarly, since the reference voltage feedback signal VREF_FB is received by the control terminal of the seventh transistor T7, a cross voltage between the reference voltage feedback signal VREF_FB and the second output signal POUT can control the conduction state of the seventh transistor T7. Further, since the feedback signal P_FB is received by the control terminal of the sixth transistor T6, a cross-voltage between the feedback signal P_FB and the first output signal POUTB can control the conduction state of the sixth transistor T6. For example, when the sixth transistor T6 and the seventh transistor T7 are enabled, since the voltages of the first output signal POUTB and the second output signal POUT are complementary, a current between the sixth transistor T6 and the seventh transistor T7 can be generated. Further, since the biased voltage signal BIAS controls the conduction state of the eighth transistor T8, a part of current between the sixth transistor T6 and the seventh transistor T7 can be transmitted to the ground terminal through the eighth transistor T8 and the ninth transistor T9. As a result, when the intensity of the current between the sixth transistor T6 and the seventh transistor T7 is changed, the gain control unit 15 can adjust the power gain by processing the first output signal POUTB and the second output signal POUT.

To sum up, the present invention discloses a reference voltage controlled equalization input data buffer circuit. The reference voltage controlled equalization input data buffer circuit can adjust power gain or voltage gain according to the reference voltage and data signal. Therefore, the reference voltage controlled equalization input data buffer circuit can automatically optimize power consumption. As a result, the reference voltage controlled equalization input data buffer circuit can be applied to a high speed DRAM system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reference voltage controlled equalization input data buffer circuit comprising:
   a first amplifier comprising:
      a first input terminal configured to receive a data signal;
      a second input terminal configured to receive a reference voltage;
      a first output terminal; and
      a second output terminal;
   a second amplifier coupled to the first output terminal of the first amplifier and the second output terminal of the first amplifier;
   a feedback signal generator coupled to the second amplifier;
   a reference voltage converter configured to receive the reference voltage;
   a reference voltage multiplexing circuit coupled to the second amplifier and the reference voltage converter; and
   a gain control unit coupled to the feedback signal generator, the first output terminal of the first amplifier, the second output terminal of the first amplifier, and the reference voltage multiplexing circuit.

2. The reference voltage controlled equalization input data buffer circuit of claim 1, wherein the first amplifier further comprises:
   a first transistor comprising:
      a first terminal configured to receive a power supply voltage;
      a second terminal; and
      a control terminal;
   a second transistor comprising:
      a first terminal configured to receive the power supply voltage;
      a second terminal; and
      a control terminal coupled to the control terminal of the first transistor;
   a third transistor comprising:
      a first terminal coupled to the second terminal of the first transistor;
      a second terminal; and
      a control terminal configured to receive the data signal;
   a fourth transistor comprising:
      a first terminal coupled to the second terminal of the second transistor;
      a second terminal coupled to the second terminal of the third transistor; and
      a control terminal configured to receive the reference voltage; and
   a fifth transistor comprising:
      a first terminal coupled to the second terminal of the fourth transistor;
      a second terminal coupled to a ground terminal; and
      a control terminal configured to receive a biased voltage signal.

3. The reference voltage controlled equalization input data buffer circuit of claim 2, wherein the first transistor and the second transistor are P-type Metal-Oxide-Semiconductor Field Effect Transistors, the third transistor, the fourth transistor, and the fifth transistor are N-type Metal-Oxide-Semiconductor Field Effect Transistors.

4. The reference voltage controlled equalization input data buffer circuit of claim 1, wherein the feedback signal generator comprises:

a plurality of first inverters coupled in series and configured to delay a signal of the first output terminal of the second amplifier for outputting a feedback signal.

5. The reference voltage controlled equalization input data buffer circuit of claim 1, wherein the reference voltage converter comprises:

a third amplifier configured to receive the reference voltage;

a first resistor string formed by coupling at least one first resistor in series, the first resistor string comprising:
a first terminal coupled to the third amplifier; and
a second terminal configured to output a first signal having a first reference voltage level;

a second resistor string formed by coupling at least one second resistor in series, the second resistor string comprising:
a first terminal coupled to the second terminal of the first resistor string; and
a second terminal configured to output a second signal having a second reference voltage level;

a third resistor string formed by coupling at least one third resistor in series, the third resistor string comprising:
a first terminal coupled to the second terminal of the second resistor string; and
a second terminal configured to output a third signal having a third reference voltage level; and a fourth resistor string formed by coupling at least one fourth resistor in series, the fourth resistor string comprising:
a first terminal coupled to the second terminal of the third resistor string; and
a second terminal coupled to a ground terminal.

6. The reference voltage controlled equalization input data buffer circuit of claim 5, wherein the reference voltage multiplexing circuit comprises:

a first switch comprising:
an input terminal configured to receive the first signal having the first reference voltage level;
a first control terminal configured to receive a first control signal;
a second control terminal configured to receive a second control signal; and
an output terminal configured to output a reference voltage feedback signal;

a second switch comprising:
an input terminal configured to receive the second signal having the second reference voltage level;
a first control terminal configured to receive a third control signal;
a second control terminal configured to receive a fourth control signal; and
an output terminal coupled to the output terminal of the first switch; and a third switch comprising:
an input terminal configured to receive the third signal having the third reference voltage level;
a first control terminal configured to receive a fifth control signal;
a second control terminal configured to receive a sixth control signal; and
an output terminal coupled to the output terminal of the first switch.

7. The reference voltage controlled equalization input data buffer circuit of claim 6, wherein the first switch, the second switch, and the third switch each further comprise pair-wised N-type Metal-Oxide-Semiconductor Field Effect Transistor and P-type Metal-Oxide-Semiconductor Field Effect Transistor, the first control signal and the second control signal are complementary, the third control signal and the fourth control signal are complementary, and the fifth control signal and the sixth control signal are complementary.

8. The reference voltage controlled equalization input data buffer circuit of claim 6, wherein the reference voltage multiplexing circuit further comprises:

a NAND gate comprising:
a first input terminal coupled to the first output terminal of the second amplifier;
a second input terminal configured to receive the third control signal; and
an output terminal;

a NOR gate comprising:
a first input terminal coupled to the first output terminal of the second amplifier;
a second input terminal configured to receive the fourth control signal; and
an output terminal;

a second inverter comprising:
an input terminal coupled to the output terminal of the NAND gate; and
an output terminal configured to output the second control signal;

a third inverter comprising:
an input terminal coupled to the output terminal of the NOR gate; and
an output terminal configured to output the fifth control signal;

a fourth inverter comprising:
an input terminal configured to receive the fourth control signal; and
an output terminal configured to output the third control signal;

a fifth inverter comprising:
an input terminal coupled to the output terminal of the second inverter; and
an output terminal configured to output the first control signal; and a sixth inverter comprising:
an input terminal coupled to the output terminal of the third inverter; and
an output terminal configured to output the sixth control signal.

9. The reference voltage controlled equalization input data buffer circuit of claim 8, wherein when the reference voltage controlled equalization input data buffer circuit is not operated under a reset state, if the first output terminal of the second amplifier is at a high voltage, the first signal having the first reference voltage level is enabled and the third signal having the third reference voltage level is disabled, and if the first output terminal of the second amplifier is at a low voltage, the first signal having the first reference voltage level is disabled and the third signal having the third reference voltage level is enabled.

10. The reference voltage controlled equalization input data buffer circuit of claim 1, wherein the gain control unit comprises:

a sixth transistor comprising:
a first terminal coupled to the first output terminal of the first amplifier;
a second terminal; and a control terminal coupled to the feedback signal generator and configured to receive a feedback signal;

a seventh transistor comprising:

a first terminal coupled to the second output terminal of the first amplifier;

a second terminal coupled to the second terminal of the sixth transistor; and a control terminal configured to receive a reference voltage feedback signal;

an eighth transistor comprising:

a first terminal coupled to the second terminal of the seventh transistor;

a second terminal; and a control terminal configured to receive a biased voltage signal; and a ninth transistor comprising:

a first terminal coupled to the second terminal of the eighth transistor;

a second terminal coupled to a ground terminal; and a control terminal configured to receive an enabling signal.

* * * * *